(12) United States Patent
Lee et al.

(10) Patent No.: US 8,071,440 B2
(45) Date of Patent: Dec. 6, 2011

(54) METHOD OF FABRICATING A DYNAMIC RANDOM ACCESS MEMORY

(75) Inventors: Po-Sheng Lee, Hsinchu County (TW); Yu-Hsien Lin, Hsinchu County (TW); Wen-Fang Lee, Hsinchu (TW)

(73) Assignee: United Microelectronics Corporation, Science-Based Industrial Park, Hsinchu (TW)

( * ) Notice: Subject to any disclaimer, the term of this patent is extended or adjusted under 35 U.S.C. 154(b) by 84 days.

(21) Appl. No.: 12/325,847

(22) Filed: Dec. 1, 2008

(65) Prior Publication Data

US 2010/0136759 A1    Jun. 3, 2010

(51) Int. Cl.
*H01L 21/8242* (2006.01)

(52) U.S. Cl. ............... 438/248; 438/405; 257/E21.646; 257/E21.647

(58) Field of Classification Search .......... 438/329, 438/328, 234, 330, 405, 248; 257/E21.464, 257/E21.647, E21.651, E21.646
See application file for complete search history.

(56) References Cited

U.S. PATENT DOCUMENTS

| | | | | |
|---|---|---|---|---|
| 6,830,968 B1 * | 12/2004 | Kim et al. | | 438/209 |
| 7,176,136 B2 * | 2/2007 | Anezaki | | 438/694 |
| 7,271,056 B2 | 9/2007 | Su | | |
| 7,332,392 B2 | 2/2008 | Lin | | |
| 7,816,226 B2 | 10/2010 | Wang | | |
| 2001/0006249 A1 * | 7/2001 | Fitzgerald | | 257/613 |
| 2003/0003651 A1 * | 1/2003 | Divakaruni et al. | | 438/243 |
| 2003/0203646 A1 * | 10/2003 | Tanabe et al. | | 438/773 |
| 2004/0023512 A1 * | 2/2004 | Yao et al. | | 438/766 |
| 2004/0029328 A1 * | 2/2004 | Lahaug | | 438/157 |
| 2004/0092133 A1 * | 5/2004 | Hyun et al. | | 438/787 |
| 2004/0121605 A1 * | 6/2004 | Maydan et al. | | 438/694 |
| 2005/0003618 A1 * | 1/2005 | Kanda | | 438/275 |
| 2005/0196919 A1 * | 9/2005 | Divakaruni et al. | | 438/243 |
| 2007/0066016 A1 * | 3/2007 | Lee et al. | | 438/257 |
| 2007/0187779 A1 * | 8/2007 | Lee et al. | | 257/390 |
| 2008/0138947 A1 * | 6/2008 | Yang | | 438/241 |
| 2010/0032742 A1 * | 2/2010 | Barth et al. | | 257/301 |
| 2010/0038746 A1 | 2/2010 | Su | | |

* cited by examiner

*Primary Examiner* — Caridad M Everhart
(74) *Attorney, Agent, or Firm* — Winston Hsu; Scott Margo

(57) ABSTRACT

A method of fabricating a dynamic random access memory is provided. First, a substrate at least having a memory device area and a peripheral device area is provided, wherein an isolation structure and a capacitor are formed in the substrate of the memory device area, and an isolation structure and a well are formed in the substrate of the peripheral device area. A first oxide layer is formed on the substrate of the peripheral device area, and a passing gate isolation structure is formed on the substrate of the memory device area at the same time. A second oxide layer is formed on the substrate of the memory device area. And a first transistor is formed on the substrate of the memory device area, a passing gate is formed on the passing gate isolation structure, and a second transistor is formed on the substrate of the peripheral device area.

14 Claims, 8 Drawing Sheets

METHOD OF FABRICATING A DYNAMIC RANDOM ACCESS MEMORY

BACKGROUND OF THE INVENTION

1. Field of the Invention

The present invention relates to a method of fabricating a dynamic random access memory (DRAM), and especially a method of fabricating a DRAM that simplifies fabricating processes.

2. Description of Related Art

DRAMs use capacitors to store information. Data content of each memory cell is read by judging charges stored in the capacitor. Sizes for present memory cells are very small. In order to increase capacitance of the capacitors to reduce possibility of error reading on data, and to further reduce refreshing frequencies to increase operation efficiency, a usual way is increasing surface areas of lower electrodes of the capacitors. By increasing the surface areas of the capacitors, sufficient storage capacitance is thereby provided. In order to satisfy requirements of the surface areas of the capacitors and of integration of the memory cells, trench capacitors have become a popular choice.

In order to enhance integration of the DRAMs, in circuit design two passing gates pass a top of the trench capacitor, and an isolation structure is used to isolate the passing gates and the trench capacitor. In prior art, a method of forming the isolation structures comprises, for example, forming a complex isolation structure comprising silicon oxide/silicon nitride on the trench capacitor.

However, the complex isolation structure comprising silicon oxide/silicon nitride requires up to 20 complex steps such as disposition of silicon oxide and silicon nitride, using a mask to form a patterned photoresist layer, using the patterned photoresist layer to etch a film of the silicon nitride, wet etching of the film of the silicon oxide, washing steps and various sorts of inspection steps. Therefore a problem of complex processes arises.

SUMMARY OF THE INVENTION

The present invention provides a method of fabricating a DRAM that simplifies fabricating processes of the DRAM and lowers cost.

The present invention provides a method of fabricating a DRAM wherein a substrate is first provided. The substrate comprises at least a memory device area and a peripheral device area; an isolation structure and a capacitor are formed in the substrate of the memory device area, and an isolation structure and a well are formed in the substrate of the peripheral device area. Next, a first oxide layer is formed on the substrate of the peripheral device area and a passing gate isolation structure is formed on the substrate of the memory device area simultaneously. Then, a second oxide layer is formed on the substrate of the memory device area. Last, a first transistor is formed on the substrate of the memory device area, a passing gate is formed on the passing gate isolation structure and a second transistor is formed on the substrate of the peripheral device area.

According to an embodiment of the present invention, in the above method of fabricating DRAM, a step of forming the first oxide layer on the substrate of the peripheral device area and forming the passing gate isolation structure on the substrate of the memory device area simultaneously comprises the following. First, a first oxide material layer is formed on the substrate of the memory device area and the peripheral device area. Next, a patterned photoresist layer is formed on the first oxide material layer of the memory device area and the peripheral device area. Then, by using the patterned photoresist layer as a mask, a part of the first oxide material layer is removed to form the passing gate isolation structure and the first oxide layer. The patterned photoresist layer is then removed.

According to an embodiment of the present invention, in the above method of fabricating a DRAM, a method of forming the first oxide material layer comprises a thermal oxidation method.

According to an embodiment of the present invention, in the above method of fabricating DRAM, the thermal oxidation method comprises an in-situ steam generation (ISSG) method.

According to an embodiment of the present invention, in the above method of fabricating a DRAM, a method of removing the part of the first oxide material layer comprises immersing the substrate forming the patterned photoresist layer in a buffer oxidation etchant (BOE).

According to an embodiment of the present invention, in the above method of fabricating a DRAM, the second transistor is a high voltage device.

The present invention provides another method of fabricating a DRAM wherein a substrate is first provided. The substrate comprises at least a memory device area and a peripheral device area; an isolation structure and a capacitor are formed in the substrate of the memory device area, and an isolation structure and a well are formed in the substrate of the peripheral device area. Next, a plurality of first oxide layers are respectively formed on the substrate of the peripheral device area, wherein the respectively formed first oxide layers have different thicknesses, and a passing gate isolation structure and a second oxide layer are respectively formed on the substrate of the memory device area, wherein a layer of the first oxide layers and the passing gate isolation structure are formed in a same step. Then, a first transistor is formed on the substrate of the memory device area, a passing gate is formed on the passing gate isolation structure and a second transistor is formed on the substrate of the peripheral device area.

According to an embodiment of the present invention, in the above method of fabricating a DRAM, a method of using the same step to form the first oxide layer and the passing gate isolation structure comprises the following. First, a first oxide material layer is formed on the substrate of the memory device area and the peripheral device area. Next, a patterned photoresist layer is formed on the first oxide material layer of the memory device area and the peripheral device area. Then, by using the patterned photoresist layer as a mask, a part of the first oxide material layer is removed to form the passing gate isolation structure and the first oxide layer. The patterned photoresist layer is then removed.

According to an embodiment of the present invention, in the above method of fabricating a DRAM, a method of forming the first oxide material layer comprises a thermal oxidation method.

According to an embodiment of the present invention, in the above method of fabricating a DRAM, the thermal oxidation method comprises an ISSG method.

According to an embodiment of the present invention, in the above method of fabricating a DRAM, a method of removing the part of the first oxide material layer comprises immersing the substrate forming the patterned photoresist layer in a BOE.

According to an embodiment of the present invention, in the above method of fabricating a DRAM, a thickness of the passing gate isolation structure formed simultaneously with the first oxide layers is enough for the passing gate isolation structure to isolate the capacitor and the passing gate.

According to an embodiment of the present invention, in the above method of fabricating a DRAM, the second transistor comprising the first oxide layer having a thickest thickness is a high voltage device.

According to an embodiment of the present invention, in the above method of fabricating a DRAM, the second oxide layer and the first oxide layer having a thinnest thickness are formed in a same step.

Accordingly, in the above method, since the passing gate isolation structure and the oxide layers of the peripheral device area are formed simultaneously, and since above processes are simply achieved by performing suitable modifications on the patterned photoresist layer in processes of forming the oxide layers, no extra steps are added. Therefore, compared with processes of complex isolation structures, in the present invention, not only 20 steps are omitted, a cost of a photomask is also saved. The present invention is beneficial to simplifying processes and saving costs.

In addition, under circumstances of predetermined formation of the oxide layers of the different thicknesses in the peripheral device area and under circumstances of being able to form the passing gate isolation structure with an sufficient thickness, the passing gate isolation structure is formed with any of the gate oxide layers in cooperation, so that there are advantages of flexibility in arrangement of processes.

To make the above and other objectives, features, and advantages of the present invention more comprehensible, several embodiments accompanied with figures are detailed as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

First Embodiment

FIGS. 1A to 1E are cross sectional views showing a fabricating flowchart of a DRAM according to the first embodiment of the present invention.

Figure 1A:
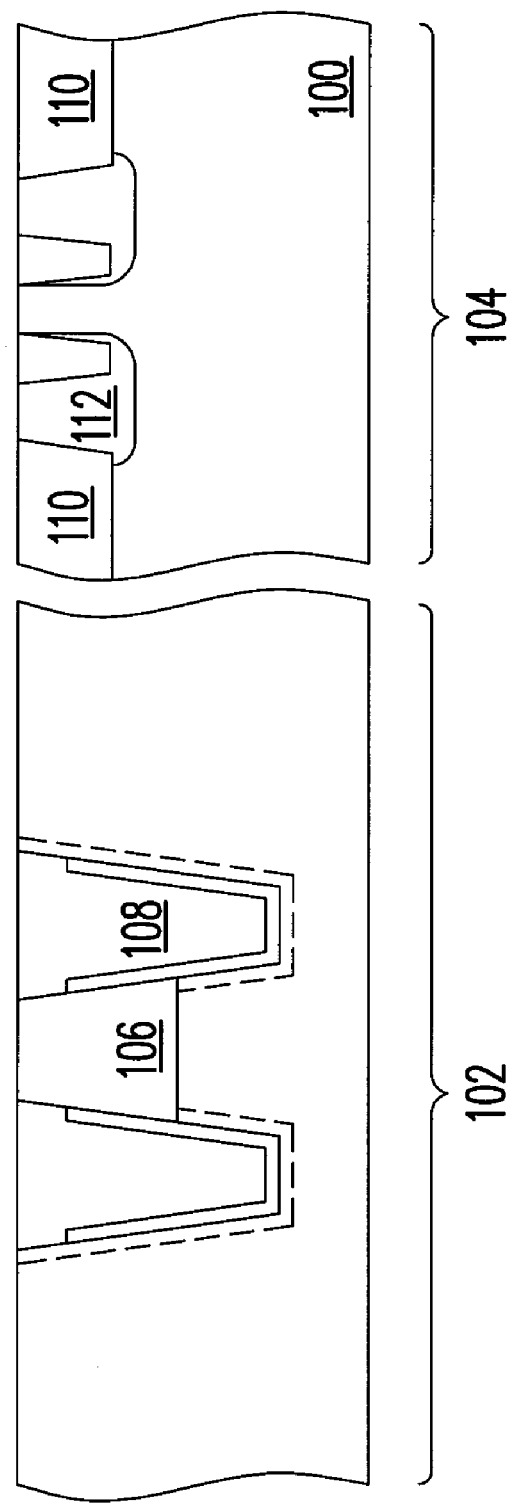
FIGS. 1A to 1E are cross sectional views showing a fabricating flowchart of a DRAM according to the first embodiment of the present invention.
Figure 1B:
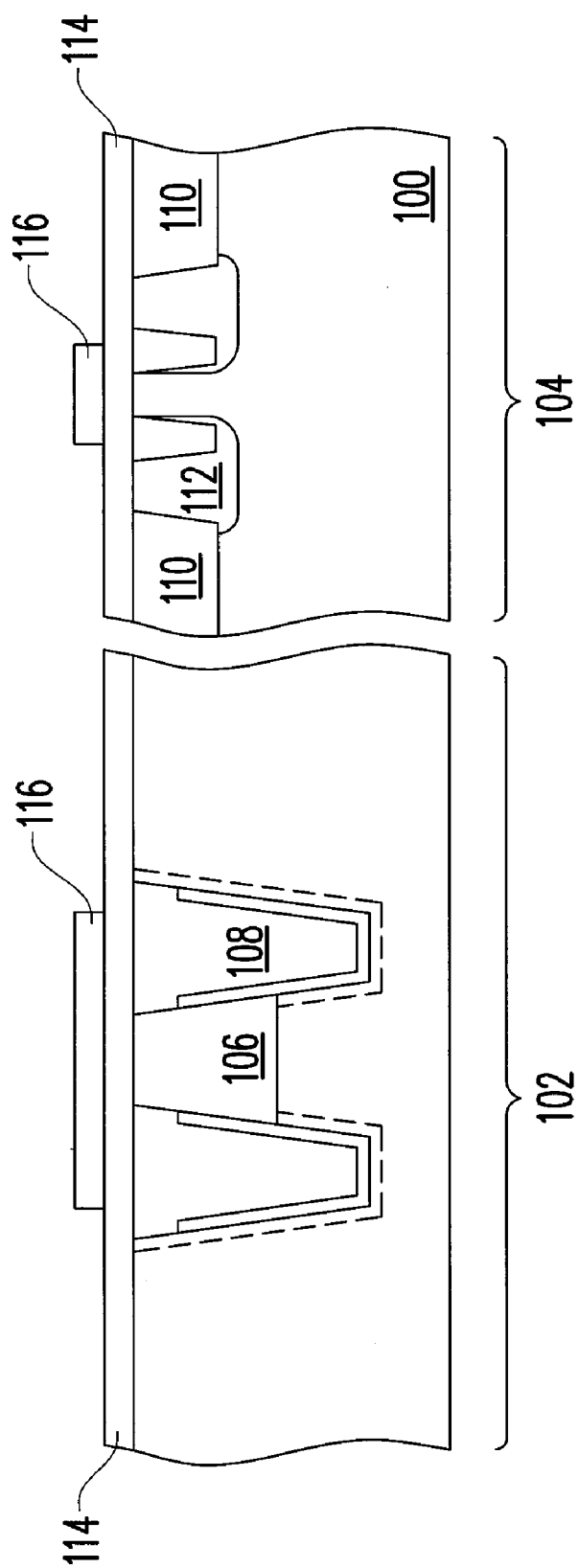

First, please refer to FIG. 1A. A substrate 100 is provided, wherein the substrate 100 comprises at least a memory device area 102 and a peripheral device area 104; an isolation structure 106 and a capacitor 108 are formed in the substrate 100 of the memory device area 102, and an isolation structure 110 and a well 112 are formed in the substrate 100 of the peripheral device area 104. Since methods of forming the above isolation structures 106 and 110, the capacitor 108 and the well 112 are well known to persons having ordinary skills in the art, the methods are omitted here. Next, please refer to FIG. 1B. An oxide material layer 114 covering at least the memory device area 102 and the peripheral device area 104 is formed on the substrate 100, wherein a method of forming the oxide material layer 114 is, for example, a thermal oxidation method. The thermal oxidation method is, for example, an ISSG method. A thickness of the formed oxide material layer 114 is, for example, around 140 Angstroms. Next, still referring to FIG. 1B, a patterned photoresist layer 116 is formed on the oxide material layer 114 of the memory device area 102 and the peripheral device area 104. A method of forming the patterned photoresist layer 116 is achieved by using, for example, common technology in the art.

Figure 1C:
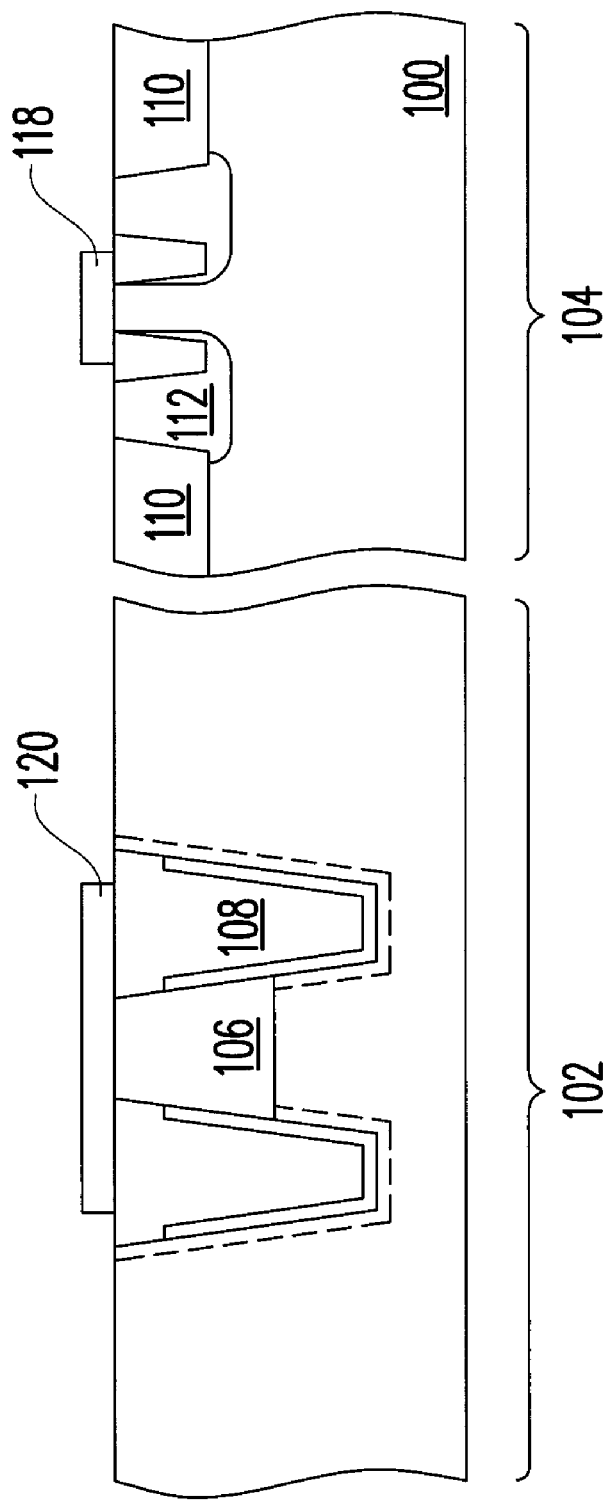

Next, please refer to FIG. 1C. A part of the oxide material layer 114 is removed so that an oxide layer 118 is formed on the substrate 100 of the peripheral device area 104 and a passing gate isolation structure 120 is formed on the substrate 100 of the memory device area 102 simultaneously. The oxide layer 118 may be used as a gate oxide layer of a high voltage device. A method of removing the part of the oxide material layer 114 is, for example, immersing the substrate 100 in a BOE by using the patterned photoresist layer 116 as a mask. After that, the patterned photoresist layer 116 is removed.

Here it should be noted that, since the passing gate isolation structure 120 and the oxide layer 118 of the peripheral device area 104 are formed simultaneously, and since above processes are simply achieved by performing suitable modifications on a pattern of a photomask used to form the patterned photoresist layer 116, no extra steps are added.

Therefore, compared with processes of complex isolation structures, in the present invention, not only 20 steps are omitted, a cost of the photomask is also saved. The present invention is beneficial to simplifying processes and saving costs.

Figure 1D:
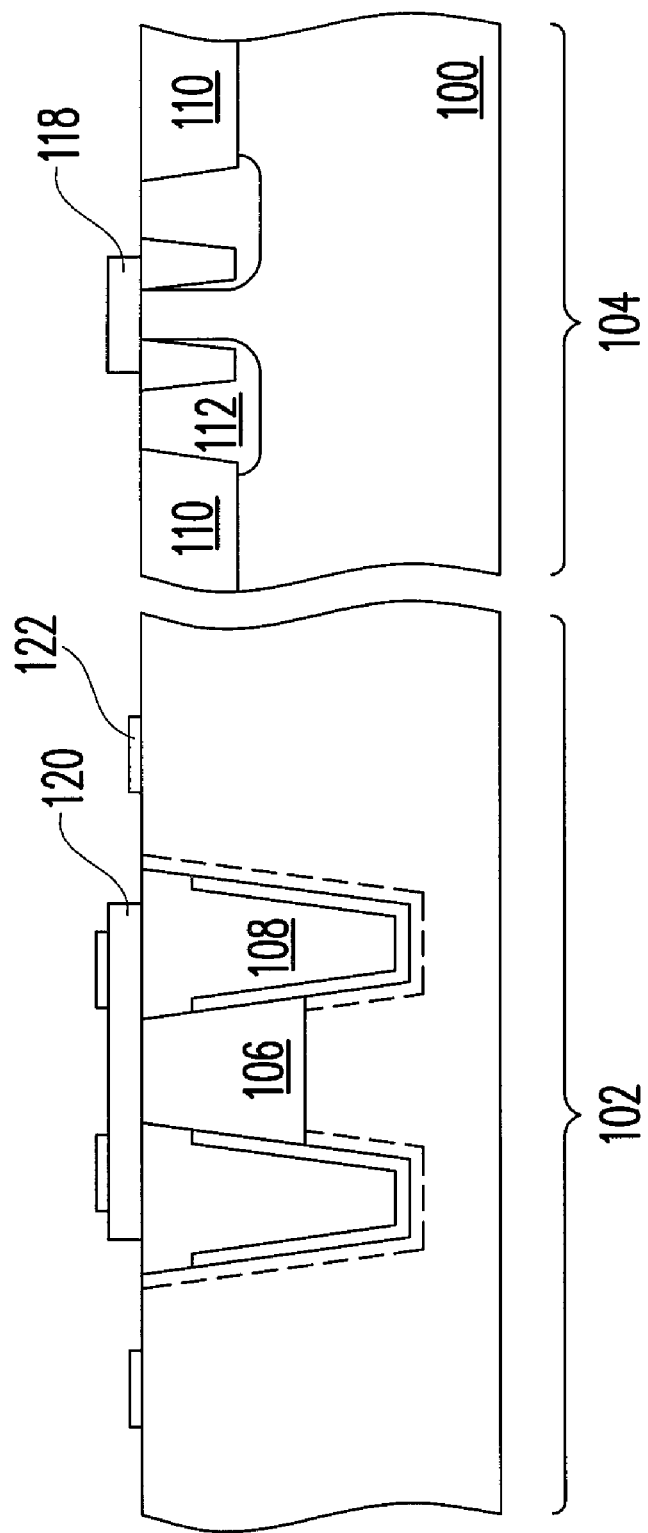

Next, please refer to FIG. 1D. An oxide layer 122 is formed on the substrate 100 of the memory device area 102. A method of forming the oxide layer 122 comprises, for example, forming an oxide material layer (not shown) on the substrate 100, forming a patterned photoresist layer (not shown) on the oxide material layer, and removing a part of the oxide material layer by using the patterned photoresist layer as a mask to form the oxide layer 122. A method of forming the oxide material layer is, for example, a thermal oxidation method, and a method of removing the part of the oxide material layer is, for example, immersing the substrate 100 in a BOE.

Figure 1E:
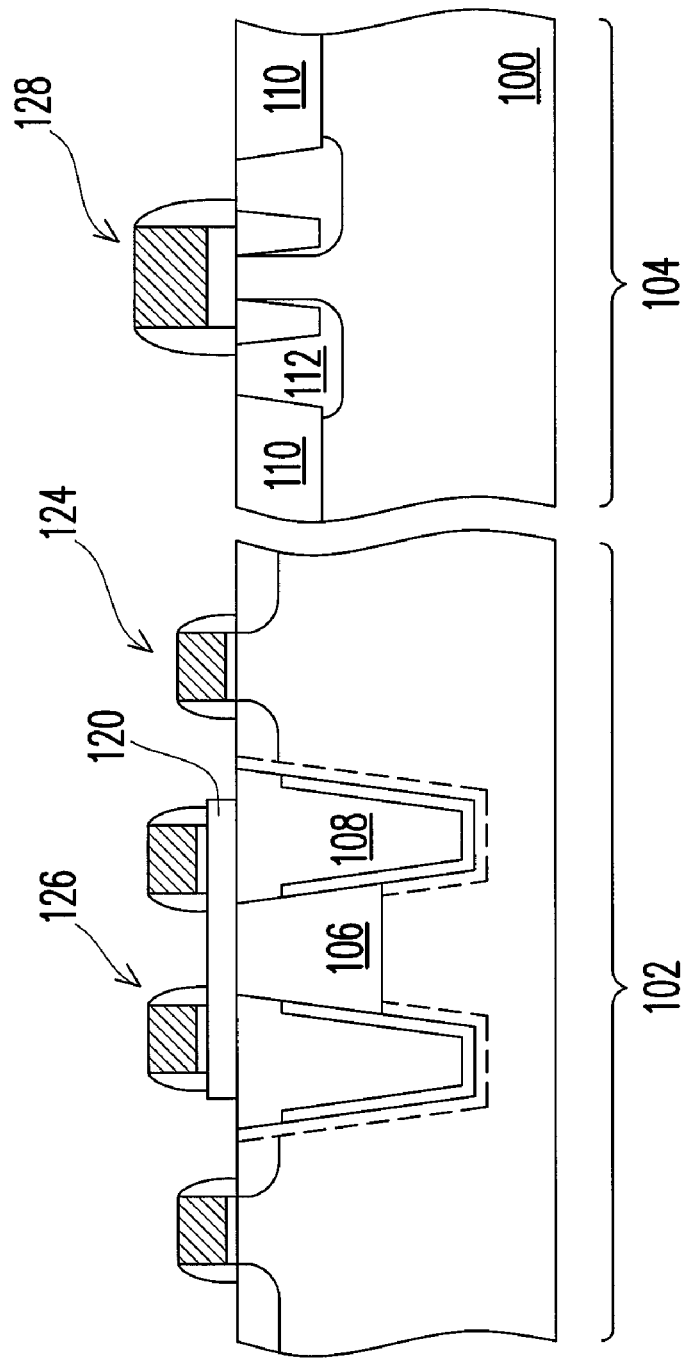

Then, the following steps may be performed to form a complete DRAM. Referring to FIG. 1E, a transistor 124 electrically connected to the capacitor 108 is formed on the substrate 100 of the memory device area 102, a passing gate 126 is formed on the passing gate isolation structure 120, and a transistor 128 is formed in the peripheral device area 104, wherein the transistor 128 is used as, for example, a high voltage device, and an operate voltage of the high voltage device is about 6.2V for example. Since methods of forming the transistors 124 and 128 and the passing gate 126 are well known to persons having ordinary skills in the art, the methods are omitted here.

Second Embodiment

Figure 2A:
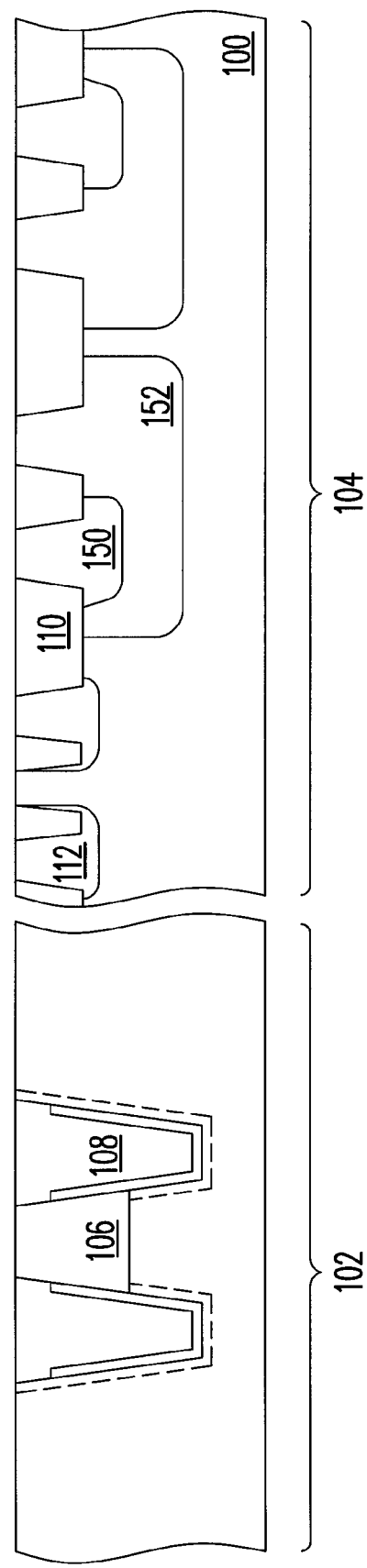
FIGS. 2A to 2C are cross sectional views showing a fabricating flowchart of a DRAM according to the second embodiment of the present invention.
Figure 2B:
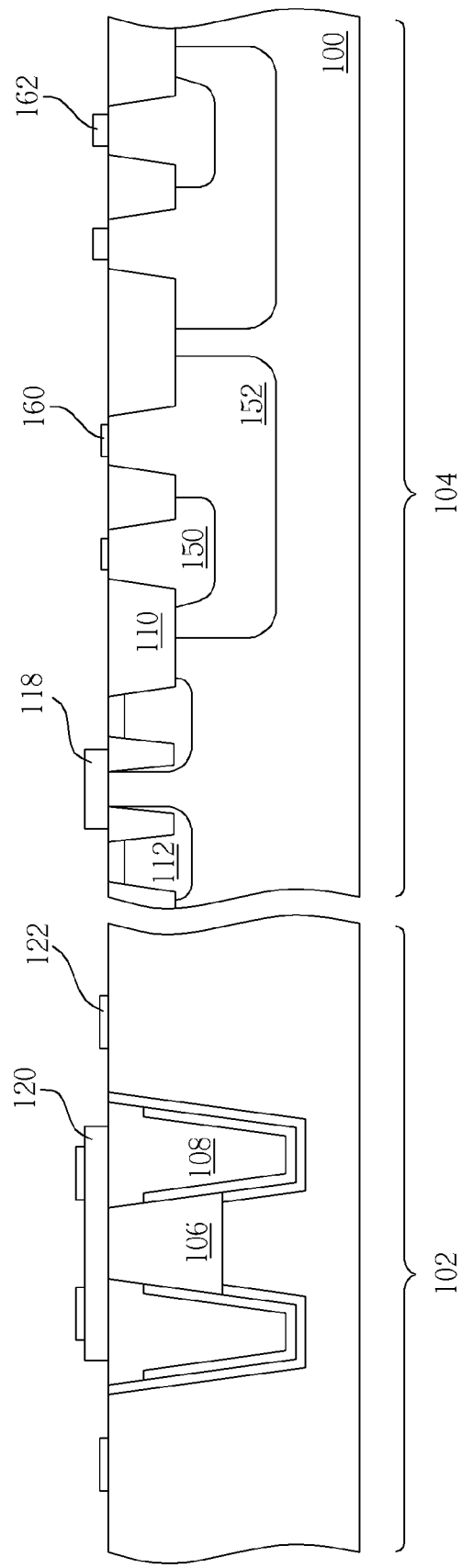
Figure 2C:
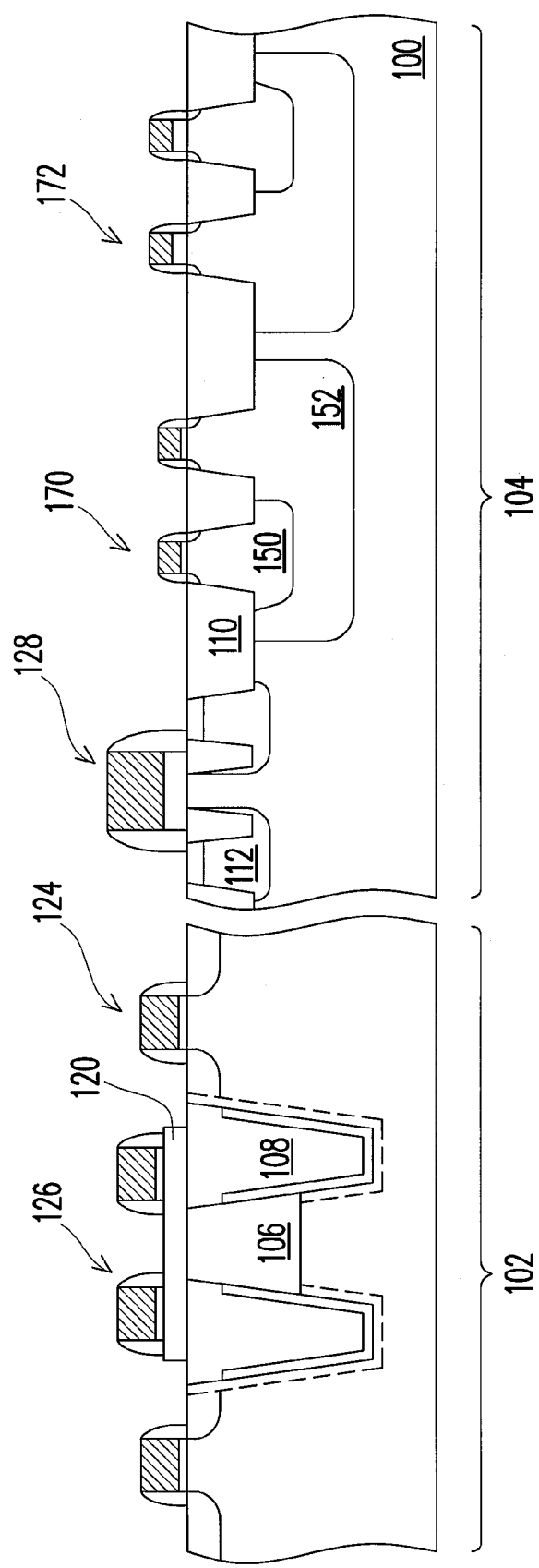

FIGS. 2A to 2C are cross sectional views showing a fabricating flowchart of a DRAM according to the second embodiment of the present invention. Referring to FIGS. 2A to 2C, same reference numerals are used to refer to same parts in FIGS. 1A to 1E, and descriptions are omitted as well.

First, please refer to FIG. 2A. A difference between FIG. 2A of the present embodiment and FIG. 1A of the first embodiment is that, referring to FIG. 2A, the peripheral device area 104 further comprises a plurality of wells 150 and 152 that are used to form other transistor devices in subsequent processes. Since methods of forming the above isolation structures 106 and 110, the capacitor 108 and the wells 112, 150 and 152 are well known to persons having ordinary skills in the art, the methods are omitted here.

Next, please refer to FIG. 2B. The oxide layer 118 and oxide layers 160 and 162 are formed on the substrate 100 of the peripheral device area 104, and the passing gate isolation structure 120 and the oxide layer 122 are respectively formed on the substrate 100 of the memory device area 102. The oxide layers 160 and 162 may be formed by repeatedly performing a method of forming the oxide layer 118, referring to FIGS. 1B and 1C. A thickness of the oxide layer 118 is, for example, 140 Angstroms; a thickness of the oxide layer 160 is, for example, 23 Angstroms; a thickness of the oxide layer 162 is, for example, 56 Angstroms.

A difference between the present embodiment and the first embodiment is that, under circumstances that the oxide layers have the thicknesses thick enough to isolate the passing gate and the transistors, the passing gate isolation structure 120 may be formed simultaneously with any of the oxide layers that have a thickness that meets the above requirements. For example, according to the present embodiment, the passing gate isolation structure 120 may be formed simultaneously with the oxide layer 118 having the thickest thickness (as according to the first embodiment), or may be formed simultaneously with the oxide layer 162. In addition, according to the present embodiment, the oxide layer 122 of the memory device area 102 may be formed alone or simultaneously with the oxide layer 160 having the thinnest thickness.

Here it should be noted that, according to the present embodiment which has advantages of the first embodiment, formation of the passing gate isolation structure 120 is not limited to cooperation with a gate oxide layer of a high pressure device. Gate oxide layers having thicknesses that meet requirements may be used in cooperation. Hence there is an advantage of high flexibility in arrangement of processes.

Then, the following steps may be performed to form a complete DRAM. Referring to FIG. 2C, the transistor 124 electrically connected to the capacitor 108 is formed on the substrate 100 of the memory device area 102, the passing gate 126 is formed on the passing gate isolation structure 120, and the transistor 128 and transistors 170 and 172 are formed in the peripheral device area 104, wherein the transistor 128 is used as, for example, a high voltage device, and an operate voltage of the high voltage device is about 6.2V for example. Since methods of forming the transistors 124, 128, 170 and 172 and the passing gate 126 are well known to persons having ordinary skills in the art, the methods are omitted here.

In addition, according to the above second embodiment, the oxide layers 118, 160 and 162 having three different thicknesses are formed on the substrate 100 of peripheral device area 104. However, the present invention is not thereby limited. According to actual requirements, oxide layers having a plurality of thicknesses may be formed on the substrate 100 of the peripheral device area 104, and processes that form the oxide layers having the thicknesses meeting the requirements are chosen to form the passing gate isolation structure 120 in cooperation.

In summary, in the above method of fabricating a DRAM, since the passing gate isolation structure and the gate oxide layers of the peripheral device area are formed simultaneously, and since above processes are achieved by performing suitable modifications on a pattern of a photomask in a process of forming the gate oxide layers, no extra steps are added. Therefore, compared with the processes of complex isolation structures in the prior art, in the present invention, not only 20 steps are omitted, a cost of the photomask is also saved. The present invention is beneficial to simplifying processes and saving costs.

In addition, under circumstances of predetermined formation of the oxide layers of the different thicknesses in the peripheral device area and under circumstances of being able to form the passing gate isolation structure with an sufficient thickness, the passing gate isolation structure is formed with any of the gate oxide layers in cooperation, so that there are advantages of flexibility in arrangement of processes.

Although the present invention has been described with reference to the above embodiments, application of the present invention is not limited to these embodiments. It will be apparent to one of ordinary skills in the present art that modifications to the described embodiment may be made without departing from the spirit of the invention. Accordingly, the scope of the invention will be defined by the attached claims and not by the above detailed descriptions.

What is claimed is:

1. A method of fabricating a dynamic random access memory, comprising:

providing a substrate, the substrate comprising at least a memory device area and a peripheral device area, wherein an isolation structure and a capacitor are formed in the substrate of the memory device area, and an isolation structure and a well are formed in the substrate of the peripheral device area;

forming a first oxide layer on the substrate of the peripheral device area and forming a passing gate isolation structure on the substrate of the memory device area simultaneously;

forming a second oxide layer on the substrate of the memory device area; and forming a first transistor on the substrate of the memory device area, forming a passing gate on the passing gate isolation structure and forming a second transistor on the substrate of the peripheral device area.

2. The method of fabricating a dynamic random access memory of claim 1, wherein the second transistor is a high voltage device.

3. The method of fabricating a dynamic random access memory of claim 1, wherein the step of forming the first oxide layer on the substrate of the peripheral device area and forming the passing gate isolation structure on the substrate of the memory device area simultaneously comprises:

forming a first oxide material layer on the substrate of the memory device area and the peripheral device area;

forming a patterned photoresist layer on the first oxide material layer of the memory device area and the peripheral device area;

removing a part of the first oxide material layer by using the patterned photoresist layer as a mask to form the passing gate isolation structure and the first oxide layer; and removing the patterned photoresist layer.

4. The method of fabricating a dynamic random access memory of claim 2, wherein the method of removing the part of the first oxide material layer comprises immersing the substrate forming the patterned photoresist layer in a buffer oxidation etchant.

5. The method of fabricating a dynamic random access memory of claim 2, wherein the method of forming the first oxide material layer comprises a thermal oxidation method.

6. The method of fabricating a dynamic random access memory of claim 4, wherein the thermal oxidation method comprises an in-situ steam generation method.

7. A method of fabricating a dynamic random access memory, comprising:

providing a substrate, the substrate comprising at least a memory device area and a peripheral device area, wherein an isolation structure and a capacitor are formed in the substrate of the memory device area, and an isolation structure and a well are formed in the substrate of the peripheral device area;

respectively forming a plurality of first oxide layers on the substrate of the peripheral device area, the respectively formed first oxide layers having different thicknesses, and respectively forming a passing gate isolation structure and a second oxide layer on the substrate of the memory device area, wherein a layer of the first oxide layers and the passing gate isolation structure are formed using a same step; and forming a first transistor on the substrate of the memory device area, forming a passing gate on the passing gate isolation structure and forming a second transistor on the substrate of the peripheral device area, wherein the second transistor comprising the first oxide layer has a thickest thickness.

8. The method of fabricating a dynamic random access memory of claim 7, wherein the second oxide layer is formed simultaneously with the first oxide layer having a thinnest thickness.

9. The method of fabricating a dynamic random access memory of claim 7, wherein the second transistor is a high voltage device.

10. The method of fabricating a dynamic random access memory of claim 7, wherein the method of using the same step to form the first oxide layers and the passing gate isolation structure comprises:

forming a first oxide material layer on the substrate of the memory device area and the peripheral device area;

forming a patterned photoresist layer on the first oxide material layer of the memory device area and the peripheral device area;

removing a part of the first oxide material layer by using the patterned photoresist layer as a mask to form the passing gate isolation structure and the first oxide layer; and removing the patterned photoresist layer.

11. The method of fabricating a dynamic random access memory of claim 10, wherein the method of removing the part of the first oxide material layer comprises immersing the substrate forming the patterned photoresist layer in a buffer oxidation etchant.

12. The method of fabricating a dynamic random access memory of claim 10, wherein a thickness of the passing gate isolation structure formed simultaneously with the first oxide layer is enough for the passing gate isolation structure to isolate the capacitor and the passing gate.

13. The method of fabricating a dynamic random access memory of claim 10, wherein the method of forming the first oxide material layer comprises a thermal oxidation method.

14. The method of fabricating a dynamic random access memory of claim 13, wherein the thermal oxidation method comprises an in-situ steam generation method.

* * * * *